SEMICONDUCTOR DEVICES AND METHOD OF MANUFACTURE THEREOF

Filed Nov. 26, 1963 3 Sheets-Sheet 1

INVENTORS
ROBERT M. MINTON &
BY RICHARD GLICKSMAN
W.S. Hill
AGENT

SEMICONDUCTOR DEVICES AND METHOD OF MANUFACTURE THEREOF

Filed Nov. 26, 1963 3 Sheets-Sheet 2

INVENTORS,
ROBERT M. MINTON &
RICHARD GLICKSMAN
BY
W. S. Hill
AGENT

SEMICONDUCTOR DEVICES AND METHOD OF MANUFACTURE THEREOF

Filed Nov. 26, 1963 3 Sheets-Sheet 3

INVENTORS
ROBERT M. MINTON &
RICHARD GLICKSMAN
BY
W. S. Hill
AGENT 3,287,186

SEMICONDUCTOR DEVICES AND METHOD OF MANUFACTURE THEREOF

Robert M. Minton, Franklin Township, Somerset County, and Richard Glicksman, North Plainfield, N.J., assignors to Radio Corporation of America, a corporation of Delaware Filed Nov. 26, 1963, Ser. No. 326,098
14 Claims. (Cl. 148—174)

This invention relates to improved semiconductor junction devices and improved methods of fabricating them. More particularly, this invention relates to improved semiconductor devices having a junction or rectifying barrier of small or restricted area.

Semiconductor junction devices such as diodes, triode transistors, tetrodes, and the like contain at least one rectifying barrier or p-n junction, and each type may be broadly classed into three groups, depending on their ability to handle high currents. The first group consists of high power devices which are capable of switching or rectifying large currents. In order to keep the current density at the junction down to tolerable levels, these devices utilize junctions or rectifying barriers of relatively large area. In such devices, the junction area may, for example, be equivalent to the area of a circle 20 mils or more in diameter. The second group consists of devices such as conventional triode transistors and diodes, which are not required to handle large currents. These types are fabricated with junctions of smaller area than the first group. Typically, the junction area of these devices may be equivalent to the area of a circle 8 to 15 mils in diameter. The third group consists of devices intended for very rapid switching applications, or rapid pulse processing, as in computers. Since low current operation is preferred for units of this type, they are generally fabricated with junctions of smaller area than the second group. The junction area of these low power devices may be equivalent to the area of a circle of three to five mils in diameter.

In some types of junction devices utilized for rapid switching and for small signal, low power level applications, such as tunnel diodes, it has been found that restriction of the active junction area of the device to an extremely small area (less than one square mil) is desirable. However, it has been found difficult to fabricate satisfactory devices with an extremely small junction area. Such units tend to be extremely fragile. It is also difficult to adjust the junction area of prior art restricted junction devices to the desired values.

Accordingly, it is an object of this invention to provide improved semiconductor devices.

Another object of this invention is to provide improved methods of fabricating improved semiconductor junction devices.

Still another object is to provide improved mechanically sturdy semiconductor junction devices having a restricted area junction.

But another object is to provide improved methods of introducing a restricted area junction in a semiconductor body.

These and other objects are attained according to the invention by providing an improved junction device comprising a crystalline semiconductive wafer of given conductivity type, a peripherally notched mask on one face of the wafer, a layer of opposite type semiconductive material on said one wafer face within said notch, and a rectifying barrier between said semiconductive layer and said wafer. An improved method of fabricating the devices according to the invention is also provided.

The invention and its advantages will be described in greater detail by the following examples, considered in conjunction with the accompanying drawing, in which:

FIGURE 1 is a graph showing the current vs. voltage curve of a tunnel diode;

FIGURES 2*a*–2*b* are cross-sectional views illustrating two steps in the fabrication of a semiconductor junction device of restricted area according to the prior art;

Figure 8:
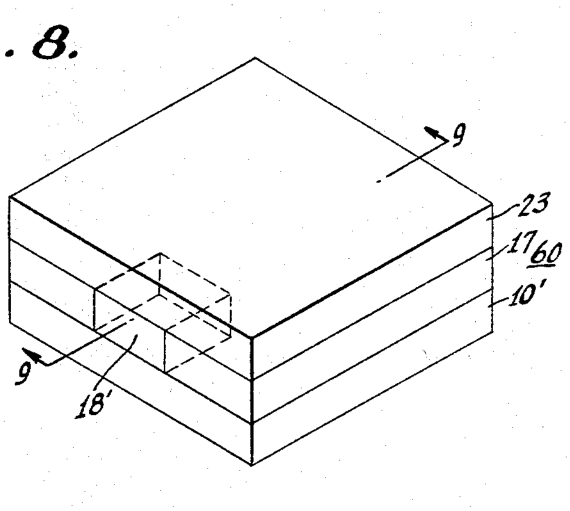
Figure 9:
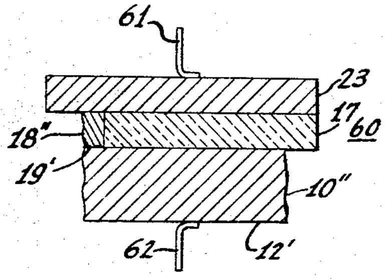
Figure 10A:
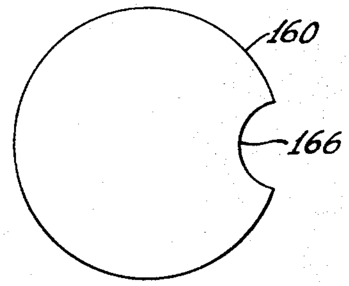
Figure 10B:
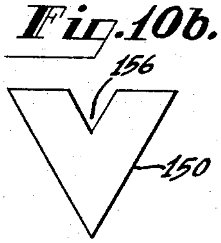
Figure 10C:
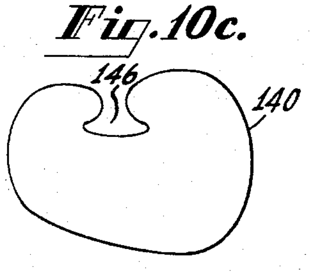

FIGURES 5*a*–7*a* and 5*b*–7*b* are plan and sectional views respectively of portions of the semiconductive body during successive steps in the fabrication of a device according to one embodiment, the scale being enlarged for greater clarity;

FIGURE 8 is an isometric view of a semiconductive die during a subsequent step in the fabrication of a junction device according to the invention;

FIGURE 9 is a sectional view of the completed junction device; and,

FIGURES 10*a*–10*c* are plan views of masked areas according to other embodiments of the present invention.

Figure 1:
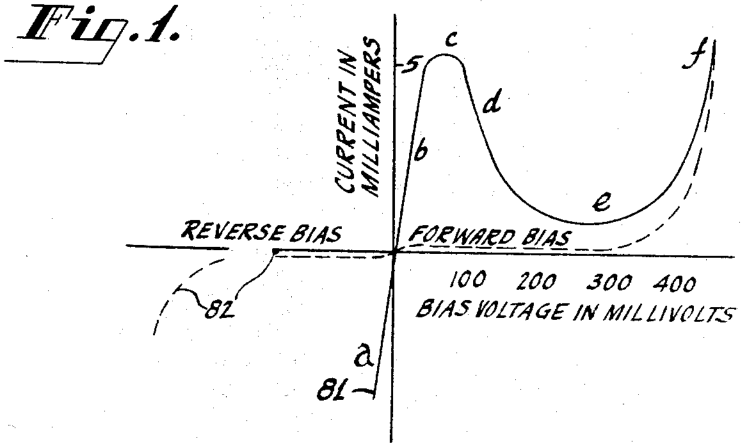

The characteristic curve of the variation of the current I with bias voltage *v* in a tunnel diode is shown in FIGURE 1. The tunnel diode contains an abrupt junction between an N-type region and a P-type region in a semiconductor wafer. Since both the N-type and the P-type regions on either side of the junction are so heavily doped that the semiconductor is considered "degenerate," that is, almost conductive, the depletion layer associated with this junction is very thin. Accordingly, it becomes possible for some charge carriers to tunnel through the thin barrier region. This tunneling of charge carriers causes the I–V characteristic of a tunnel diode, shown by the solid line 81 in FIGURE 1, to differ markedly from the conventional diode, which is shown by the dotted line 82 in FIGURE 1. The conventional diode is blocking in the reverse direction until its breakdown voltage is reached, and does not pass much current in the forward direction until a characteristic forward voltage is applied.

The tunnel diode is highly conducting for all bias voltages in the reverse direction, as shown in portion *a* of the I–V curve 81 in FIGURE 1. At low forward bias, typically up to 100 millivolts, the current increases linearly in voltage, as shown in portion *b* of curve 81. The current reaches a maximum value known as the peak current (symbolized as $I_p$) in portion *c* of curve 81. With increasing forward bias, there is a region known as the negative resistance region, which is shown as portion *d* of curve 81. In this region, the current decreases linearly with increasing voltage until it reaches a minimum value. The negative resistance of the diode is equal to the reciprocal of the slope of this portion *d* of the curve. The minimum current value attained at the end of the negative resistance region is known as the valley current (symbolized as $I_v$) and is shown as portion *e* of curve 81. Thereafter, the current increases exponentially with increasing forward bias, in the same manner as a conventional diode, as shown in portion *f* of current 81.

The p-n junction in the tunnel diode may be regarded as the equivalent of a parallel plate condenser, in which the two parallel plates have the same area as the junction, and are separated by the thickness of the transition region (also known as the depletion layer) between the P-type and N-type regions, with the space between the two plates filled with an insulating material having the same dielectric constant as the semiconductor. The junction capacitance affects the electrical characteristics of the device. For example, the expression for the gain-bandwidth product $G\Delta f$ of a tunnel diode utilized as an amplifier is $1/2\pi RC$, and the expression for the maximum operating frequency $f_0$ of a tunnel diode utilized as an oscillator is $(R/r-1)^{1/2}(1/2\pi RC)$, where $r$ is the total positive resistance in the signal circuit and is termed the series resistance; R is the negative resistance of the diode; and C is the capacitance of the diode, including the junction capacitance.

Restricted junction areas are desired in tunnel diodes to reduce the value of the peak current $I_p$. The peak current $I_p$ of the device is directly proportional to the junction area and exponentially proportional to the charge carrier concentrations on both sides of the junction. In a germanium tunnel diode having a junction area equivalent to an 8 mil diameter circle, the peak current might be as high as 5 amperes. This value is much too high for devices intended to operate at low power levels such as one milliampere. It is therefore necessary to reduce the junction area of such a device to about $\frac{1}{5000}$ of its original area in order to reduce the peak current to an acceptable level.

It has been found that the switching time of a tunnel diode in seconds is approximately equal to $[(V_f-V_p)/(I_p-I_v)]$ (C), where $V_f$ is the applied forward bias voltage in millivolts, measured at peak current past the valley voltage, $V_p$ is the peak voltage in millivolts, $I_p$ is the peak current in milliamperes, $I_v$ is the valley current in millamperes, and C is the capacitance of the unit in farads, that is, the junction capacitance plus any associated capacitance due to the case and the leads. Thus in order for the tunnel diode to switch rapidly, the junction capacitance, and hence the junction area, should be small.

Various methods have been utilized to fabricate semiconductor devices having a junction restricted to a small area. One method has been to introduce a conductivity type-determining material, that is, an acceptor or a donor, into an exposed portion of the upper surface of a mesa on a semiconductor wafer. Typically, units of this type have a junction area which is about one mil wide and three mils long. However, it is difficult to form a good electrical connection to the junction in such mesa units. More important, it is not possible to adjust the junction area and junction capacitance to some desired value after the junction has been formed.

Figure 2A:
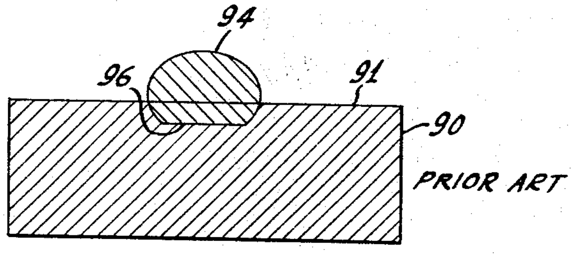
Figure 2B:
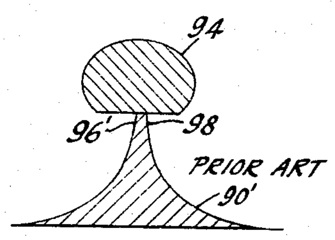

Another method has been to alloy a conductivity type-determining pellet 94 of convenient size to one face 91 of an opposite conductivity type semiconductive wafer 90, thereby forming a rectifying barrier or p-n junction 96 between the pellet and the wafer, as shown in FIGURE 2*a*. The pellet or dot 94 may, for example, be a spherule or a disc having a diameter of about 5 to 8 mils. An electrical lead wire is readily attached to an alloyed pellet of this size. A portion of the semiconductive wafer 90 around the alloyed pellet 94 is then removed as shown in FIGURE 2*b*, for example, by electrolytic etching, so as to reduce the area of the junction to the desired value 96'. Thus in this method, electrical connections are readily fabricated, and the junction area formed may be conveniently reduced to the desired area. However, a serious difficulty in this method is that it is necessary for reduction of the junction area to remove a large portion of the semiconductor wafer material immediately beneath the pellet, so that the resulting device comprises an alloyed mass of conductivity type-determining material which overhangs the top of a small spike 98 of semiconductive material containing the junction 96'. This structure is mechanically weak and fragile, so that units thus fabricated have a high scrap rate and are easily injured by shock or vibration.

*Example I*

Figure 3:
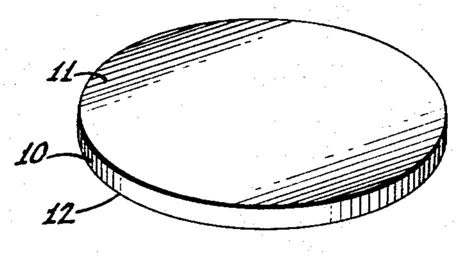
FIGURE 3 is a perspective view of a body of semiconductive material utilized in the fabrication of a junction device according to one embodiment of the invention.

According to one embodiment of the invention, restricted area low capacitance junction devices are fabricated of a body or wafer of semiconductive material such as a cross-sectional slice of a monocrystalline ingot. Any crystalline semiconductive material, such as germanium, silicon, germanium-silicon alloys, cadmium sulfide, indium phosphide, gallium arsenide, silicon carbide, and the like, may be utilized for this purpose. The material utilized may be of either conductivity type. Suitable acceptors for germanium, silicon, and germanium-silicon alloys are boron, aluminum, gallium, and indium; suitable donors for these materials are phosphorous, arsenic, and antimony. In this example, the semiconductive slice or wafer 10 consists of P-type germanium, and has the shape of a disc with two opposing major faces 11 and 12, as shown in FIGURE 3. The wafer or slice 10 in this example is about 9 mils thick, 1" in diameter, and contains sufficient gallium to have a concentration of about $1\times10^{19}$ to $1\times10^{20}$ charge carriers per cm.$^3$. The precise conductivity and dimensions are not critical. Advantageously, the slice 10 is cleaned to remove any debris and impurities on the surface thereof by immersing the slice for a few seconds in a mild etchant. A suitable etchant for germanium wafers consisting of one part by volume of a solution of 55 grams potassium iodide in one hundred ml. water, with 4 parts by volume of a solution consisting of 6 volumes water, 3 volumes concentrated acetic acid and one volume concentrated hydrofluoric acid, may be used for this purpose. If desired, one major face 11 of the slice 10 may be additionally cleaned by ion bombardment in vacuo, utilizing nitrogen ions from a glow discharge of 2000 volts D.C. at a current density of 0.2 ma./cm.$^2$.

Figure 4:
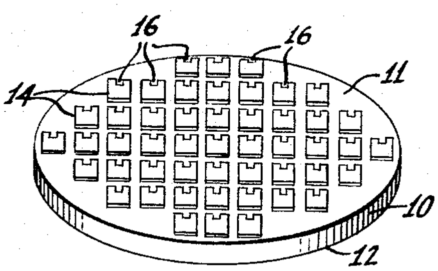
FIGURE 4 is a perspective view of the semiconductive body with one major face thereof masked in accordance with one embodiment of the invention.

Limited areas 14 (FIGURE 4) of wafer face 11 are then masked by any convenient method. Suitable masking materials are of dielectric material, that is, electrically insulating material. For example, a colloidal suspension of graphite or of magnesium hydroxide may be applied through a silk screen or a stencil to the desired portions of wafer face 11. Alternatively, masking may conveniently be accomplished by maintaining wafer 10 at 150° C. in a vacuum evaporator, and positioning over wafer face 11 a metal plate as an evaporation mask (not shown) having a regular array of identical perforations. The shape of each perforation corresponds to the areas which are to be masked. An inert material such as silicon monoxide or magnesium fluoride is then evaporated through the perforations on the corresponding areas of wafer face 11. The precise size and shape of the masked areas 14 is not critical, but each masked area 14 has an identical notch 16 at its periphery. The precise size and shape of the peripheral notch 16 is not critical. Suitably, the area of each notch 16 is about $\frac{1}{5}$ to $\frac{1}{100}$ of the area each masked area 14 would have in the absence of the peripheral notch.

Figure 5A:
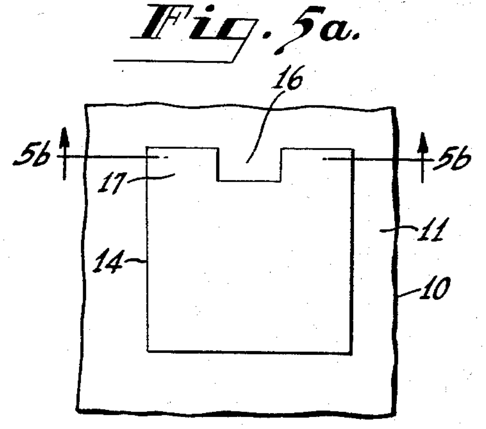
Figure 5B:
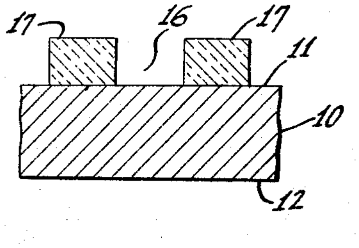
Figure 6A:
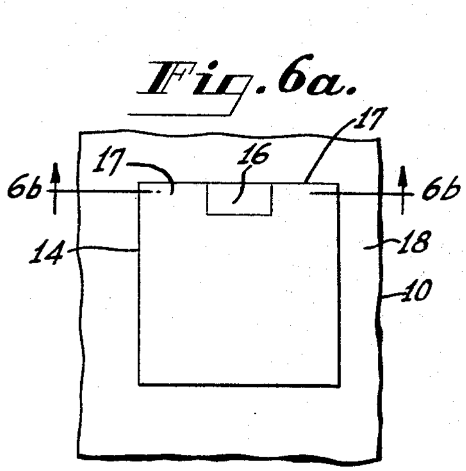
Figure 6B:
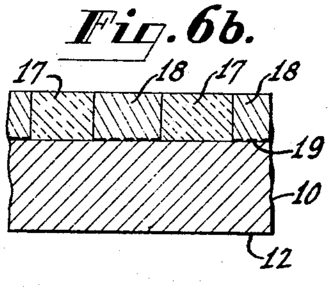
Figure 7B:
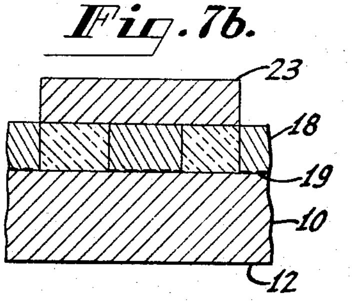
Figure 7A:
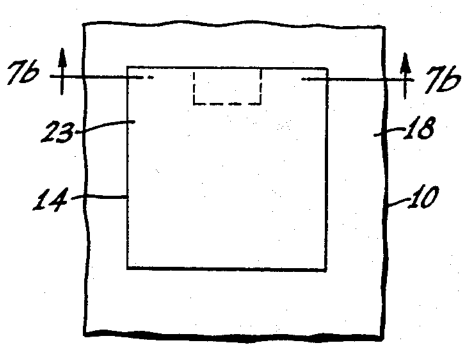

FIGURE 5*a* is an enlarged plan view of a portion of semiconductive slice 10, showing a single masked area 14 and its peripheral notch 16 in accordance with this example. In this embodiment, each masked area 14 is a square 18 mils on edge, except for the notch. Each peripheral notch 16 is a rectangle 6 mils long and 3 mils wide. The area of peripheral notch 16 is thus 18 square mils, while the area of the entire masked portion 14 is 306 (324—18) square mils. The ratio of the notched area 16 to the masked area 14 is $\frac{1}{17}$ in this example. FIGURE 5*b* is a cross-sectional view in the direction of the arrows taken along the line **5*b*—5*b*** of the portion of the wafer shown in FIGURE 5*a*. In this example, the masking film 17 which is deposited on the predetermined areas 14 consists of silicon monoxide, and is about 2 microns thick. The exact thickness of the mask 17 is not critical. Other thicknesses such as 0.1 to 100 microns may also be utilized for the masking film 17. Other masking materials such as magnesium fluoride, magnesium oxide, and the like, may be utilized for this purpose, provided they are electrically inert with respect to the semiconductor material of the slice or substrate 10.

An epitaxial layer 18 (FIGURES 6*a* and 6*b*) of semiconductive material of a conductivity type opposite to that of the slice of the substrate 10 is now deposited by known techniques on the unmasked portions of major wafer face 11. In this example, since the substrate wafer 10 consists of P-type germanium, the epitaxial layer 18 deposited in this example consists of N-type germanium. A rectifying barrier or p-n junction 19 is thus formed between the P-type semiconductive wafer or slice 10 and the N-type epitaxial layer 18. Since a very abrupt and thin junction is desired for tunneling devices, the epitaxial layer 18 is heavily doped. In this example, the epitaxial layer 18 is doped with sufficient arsenic to have a charge carrier concentration of about $4 \times 10^{19}$ per $cm.^3$.

The epitaxial layer 18 may be deposited from the vapor phase by any convenient method of the semiconductor art, for example by passing a mixture of hydrogen and a germanium halide such as germanium chloride over the wafer in a reaction chamber or furnace tube, while heating the wafer to a temperature sufficient to cause the germanium halide and hydrogen to react, thus depositing germanium on the exposed portion of the wafer. Other vapor phase methods, such as iodine transport, or the evaporation of germanium from a closely spaced source, may also be employed. A convenient method of depositing an epitaxial layer from the liquid phase is known as the solution growth technique. For a detailed description of this method of depositing an epitaxial semiconductive layer, see Ditrick and Nelson, "Design and Fabrication of Germanium Tunnel Diodes," RCA Engineer, August–September 1960, pages 19–22.

Since the peripheral notches 16 are part of the unmasked area on wafer face 11, they are also covered by epitaxial layer 18, as shown in plan in FIGURE *6a*. FIGURE *6b* is a cross-sectional view along the line *6b*—*6b* of the wafer of FIGURE *6a*.

Referring now to FIGURE 7, a metallic layer 23 is deposited on wafer face 11 so as to cover only the masked areas 14 and the peripheral notches 16 associated with each masked area. Deposition of the metallic layer is conveniently accomplished by evaporation through a mask. The metals or alloys utilized for this purpose are preferably those which make an ohmic contact to the semiconductive epitaxial layer. In some cases, a single metal is sufficiently adherent to the semiconductive wafer. For example, chromium and aluminum are sufficiently adherent that they may be used alone on silicon. In this example, the metallic layer 23 is a film of evaporated gold. The exact thickness of layer 23 is not critical, and may for example be about 0.1 to 100 microns. For some semiconductive materials, it may be preferred to utilize an alloy or a mixture of metals, or a composite metallic layer consisting of several different metals.

The slice 10 is now diced into a plurality of pellets or dies. Each pellet corresponds in size and shape to one of the previously masked areas 14 with its associated notch 16. Thus, in this example the major faces of each pellet is a square 18 mils on edge. FIGURE 8 is an isometric view of one such pellet or die 60. The die 60 consists of the original wafer material 10', which in this example, is gallium-doped P-type germanium; a layer 17 of an inert masking material covering the major part of one face of layer 10'; an epitaxial layer 18' of opposite type semiconductive material (which, in this example, is arsenic doped N-type germanium) on that portion of said one face of layer 10' which is not covered by the mask 17; and a metallic layer 23 over both the masking layer 17 and the epitaxial semiconductive layer 18'. The metallic layer 23 consists of material which makes an ohmic contact to the epitaxial semiconductive layer 18'. Although in this example the metallic layer 23 consists of gold alone, in some cases it may be desirable to first deposit a thin film or strike of a very adherent metal such as chrominum on the semiconductive wafer, and then deposit the gold on the chrominum, thus improving the adherence of the metallic layer. The epitaxial semiconductive layer 18' is always on the periphery of the die 60.

The peak current $I_p$ of each unit can now be adjusted to a particular desired value by removing a portion of the epitaxial layer 18', thereby reducing the area and capacitance of the p-n junction 19. One method of removing a portion of the epitaxial layer 18 is by electrolytic etching. Alternatively, other methods of removing a portion of the epitaxial layer may be utilized, such as chemical etching and the like. A portion of the original wafer material 10' may be removed at the same time that the epitaxial layer is being etched, but this does not affect the parameters of the device. Although after a portion of the epitaxial layer 18' is removed, the remaining portion of the junction 19 may be small in area, it is sturdily supported between the metallic layer 23 and the original semiconductive material 10'.

One way, for example, to accomplish this partial removal of the epitaxial layer 18' is as follows: Each individual die 60 is treated in an etchant which slowly and peripherally attacks the semiconductive material of the wafer 10' and of the epitaxial layer 18', but is relatively inert with respect to the metallic layer 62. A suitable etchant for the germanium devices of this example is a solution of concentrated (about 20 to 40 weight percent) potassium hydroxide. Any other convenient etchant, such as concentrated hydrogen peroxide, may be utilized instead of potassium hydroxide. Peripheral portions of the semiconductive material are thus removed, leaving die 60 as shown in FIGURE 9, which is a cross-sectional view of the die of FIGURE 8 along the line 9—9 looking in the direction of the arrows after the etching step. The epitaxial layer 18' (after etching indicated as 18'' in FIGURE 8), which was formerly 6 mils long and 3 mils wide, is thus easily reduced in width to any desired fraction of its original width, say from ½ to ⅕₀₀₀ for example. The amount of this reduction in width varies with the requirements of the particular unit being fabricated, and is smoothly and readily controlled by adjusting the concentration of etchant in the etching bath, the temperature of the etching bath, and the period of time the unit is treated in the etching bath. In this example, the area of the rectifying barrier 19', and hence the peak current of the device, is reduced in the same ratio as the reduction in average width of the epitaxial layer 18''. The average width of the epitaxial layer 18'' may easily be reduced to .06 mils, which reduces the junction area and peak current to ⅕₀ of its original value. If desired, the average width of the epitaxial layer 18'' may be further reduced to .003 mils, thus reducing the junction area and peak current of the device to ⅟₁₀₀₀ of its original value.

The device may be completed by bonding a first electrical lead wire 61 to the metallic layer 23 of the die 60. The first lead wire 61 serves as an electrical connection to to the epitaxial layer 18''. A second lead wire 62 is bonded to surface 12' of germanium layer 10''. The second lead wire 62 serves as an electrical connection to the semiconductive layer 10''. The lead wires 61 and 62 may be bonded by any convenient method, such as by soldering, or by thermocompression bonding. The subsequent steps of encapsulating and casing the device are accomplished by standard techniques of the semiconductor art, and need not be described here.

Alternatively, the device may be mounted in a low impedance enclosure such as that illustrated in FIGURE 1 of U.S. 3,001,113, issued September 1961 to C. W. Mueller, and assigned to the assignee of this application. If desired, the die 60 as in the instant FIGURE 8 may be mounted in such an enclosure prior to the etching step, and the assemblage hermetically sealed only after the junction area has been reduced to the desired value by treating the assemblage of device and enclosure in an etching bath. As described in the Ditrick and Nelson publication mentioned above, electrolytic etching may be employed for this purpose, and the peak current of the device may be monitored during the etching process so as to stop the etching when the desired value of peak current has been obtained.

The resultant structure avoids the limitation on low junction area imposed in prior art devices by considerations of mechanical strength, and enables the fabrication of tunnel diodes having junction capacitances as low as 0.1 picofarad, and having relatively low series resistance and inductance. Another advantage of this method is that it allows the use of semiconductive materials with higher charge carrier concentrations, for example, germanium containing $8\times10^{19}$ to $1\times10^{20}$ charge carriers per cm.$^3$, in the fabrication of tunnel diodes having low peak currents. The use of semiconductor materials having high charge carrier concentrations results in high frequency low power level devices.

It will be understood that the precise shape of the masked area and its peripheral notch is not critical, but the shape of the notch affects the rate at which the area of the junction is decreased. The masked area may be a circular area 160, as in FIGURE 10*a*, with a peripheral notch 166 which is substantially semicircular. Alternatively, the masked area may be a triangular area 150, as in FIGURE 10*b*, with a peripheral notch 156 which is also triangular. Moreover, the masked area need not have any regular geometric shape, and may be a free form or irregular area such as area 140 in FIGURE 10*c*, with an irregular peripheral notch 146.

Since the etching of the epitaxial semiconductive layer of the device to reduce its junction area proceeds inwardly from the periphery of the device, it will be noted that the shape of the peripheral notch affects the rate at which the junction area (and peak current) of the device is reduced with increasing time of immersion in the etchant. Thus, in those embodiments wherein the peripheral notch is either square or rectangular in shape, such as in notch 16 as in Example I above, the reduction in area of the epitaxial layer and of the p-n junction beneath it occurs linearly with etching time at the same rate as the reduction in width of the epitaxial layer. When the peripheral notch is so shaped as to be wider at the periphery but narrower with increasing depth, for example, shaped like notch 166 in FIGURE 10*a* or like notch 156 in FIGURE 10*b*, then as the epitaxial layer is etched inwardly from the device periphery, the area of the p-n junction associated with the epitaxial layer at first decreases rapidly as the wider portion of the epitaxial layer is removed, then decreases more slowly as the narrower portion of the epitaxial layer is reached. In contrast, when the peripheral notch is shaped so as to be narrower at the periphery but wider with increasing depth, for example, shaped like notch 146 in FIGURE 10*c*, then as the epitaxial layer is etched inwardly from the device periphery, the area of the p-n junction associated with the epitaxial layer will at first decrease slowly, as the narrower portion of the epitaxial layer is removed, then decrease more rapidly, as the wider part of the epitaxial layer is reached. The rate at which the junction area is decreased with etching time may thus be made linear or non-linear as desired.

The effect of the shape of the peripheral notch may be illustrated as follows. When each die is being etched for a period of one minute in order to reduce the junction area and peak current to a desired uniform value, and the peripheral notch and the epitaxial layer beneath it are shaped like a rectangle or square, that is, has a constant cross section, then if any one unit is kept in the etching bath for one second too little or too long, the junction area and peak current will differ from the desired value by a factor of $\frac{1}{60}$, or almost 2%. The junction area and peak current in this case vary directly as the variation in etching time. If the peripheral notch does not have a constant cross section, but is shaped as in FIGURE 10*c*, so that the cross section of the peripheral notch increases with increasing depth, then a one second variation in etching time produces a variation in junction area and junction capacitance which is considerably greater than 2%, since the first part of the etching of the epitaxial layer is performed at the location where peripheral notch 146 and the associated epitaxial layer are narrow, while the last part of the etching is performed where peripheral notch 146 is wide. However, if the peripheral notch is shaped as in FIGURE 10*b* or FIGURE 10*a*, so that the cross section of the peripheral notch decreases with increasing depth, then a one second variation in etching time produces a variation in junction area and junction capacitance which is considerably less than 2%, since the last part of the etching of the epitaxial layer associated with the notch is performed at the location where peripheral notches 156 and 166 are narrow.

*Example II*

In the previous embodiment, the original semiconductive body 10 consisted of gallium doped P-type germanium, and the epitaxial layer consisted of arsenic doped N-type germanium. In this example, the general method utilized is similar to that described above in Example I, and illustrated in FIGURES 1–7, but the semiconductive body 10 consists of phosphorus doped N-type silicon, and the epitaxial layer 18 deposited on the unmasked portions of one major face of body 10 consists of boron doped P-type silicon. The masking material 17 may consist of a polymer such as a silicone, or a glassy inorganic material, or any of the electrically inert materials previously mentioned. Silicon dioxide may also be utilized as the masking material. When the semiconductive body consists of silicon, as in this example, an adherent silicon oxide layer may be produced on the entire surface of the body by heating the silicon body in an oxidizing ambient such as steam. The undesired portions of the silicon oxide layer are removed by known photolithographic masking and etching techniques. The remaining portions of the silicon oxide layer are then utilized as a mask in order to control the deposition of the epitaxial layer. The metallic layer 23 in this example suitably consists of aluminum or chromium. Aluminum makes a good ohmic contact to the P-type epitaxial silicon layer of this embodiment. When the semiconductive body and the epitaxial layer thereon consists of silicon, as in this example, the etchants utilized will generally consist of or include hydrofluoric acid. Silicon tunnel diodes that have low junction areas and low peak currents, but are mechanically sturdy, may thus be fabricated otherwise in the same manner as the germanium units described above in Example I.

*Example III*

In this example, the semiconductive body 10 consists of zinc doped P-type gallium arsenide; the epitaxial layer 18 consists of selenium doped N-type gallium arsenide; and the metallic layer 23 consists of silver. The inert masking material may, for example, consist of silicon oxide deposited on the semiconductive body by the method described in U.S. Patent 2,089,793, issued May 14, 1963 to E. L. Jordan and D. J. Donahue, and assigned to the assignee of this application. The conductivity type of the gallium arsenide semiconductive body and the gallium arsenide epitaxial layer thereon may be reversed, utilizing tellurium doped N-type gallium arsenide as the semiconductor body 10 and cadmium doped P-type gallium arsenide for the epitaxial layer 18. Other III–V semiconductive compounds such as indium phosphide, gallium phosphide, and gallium antimonide may be similarly utilized. Suitable acceptors for these compounds are zinc, cadmium and manganese; suitable donors for the III–V compounds are sulfur, selenium and tellurium. A suitable etchant for the semiconductive III–V compounds is composed of equal volumes of concentrated nitric acid and concentrated hydrochloric acid. The fabrication of a mechanically sturdy device having a low junction area (and hence a low junction capacitance and low peak current) is accomplished in a manner similar to that described in Example I above.

*Example IV*

In the previous examples, the semiconductive epitaxial layer 18 consisted of the same material as the semiconductive body 10, although they were of opposite conductivity types. A device may be fabricated in which the epitaxial layer 18 is not only of conductivity type different from that of the semiconductive body 10, but also of different semiconductive material. Such junctions between different semiconductive materials are known as heterojunctions. They are preferably prepared from a pair of crystalline semiconductors which have the same crystal structure, and which have closely matching lattice constants. A heterojunction device may be fabricated by masking a semiconductive body 10 consisting of P-type silicon, and depositing on the unmasked portions thereof, an epitaxial layer 18 consisting of N-type germanium, or of N-type germanium-silicon alloy. Heterojunction devices may also be fabricated utilizing appropriate pairs of III–V compounds for the semiconductive body and the epitaxial layer thereon, for example, a gallium phosphide semiconductive body and a gallium arsenide epitaxial layer thereon. Another suitable pair of III–V compounds consists of a gallium arsenide semiconductive body and an indium arsenide epitaxial layer thereon. The steps of fabricating from these materials a mechanically sturdy semiconductive junction device having a low junction area are similar to those described in Example I above.

While the embodiments described in the above examples are preferred forms of the invention, they have been set forth by way of illustration only, and not limitation. For example, other crystalline semiconductive materials, other doping agents, and other etchants may be utilized. The area of the epitaxial layer and its associated rectifying barrier may be reduced by lapping or cutting the die along the edge adjacent to the peripheral notch, as well as by chemical or electrolytic etching. Other metals or alloys may be employed for the metallic layer 23, and may be deposited by other methods, including electroplating and electroless plating. Other electrically inert materials may be used as the mask materials, provided they are sufficiently refractory to withstand the temperature used in depositing the epitaxial layer. It will be understood that various changes and modifications may be made by those skilled in the art without departing from the spirit and scope of the invention as described in the specification and the appended claims.

What is claimed is:

1. The method of fabricating a semiconductor junction device, comprising the steps of applying a mask of dielectric material having a peripheral notch to a limited area on one face of a given conductivity type crystalline semiconductive body;

depositing a layer of opposite conductivity type crystalline semiconductive material on the unmasked portion of said major face within said notch to form a rectifying barrier between said semiconductive layer and said body;

depositing a metallic layer over said mask and over said opposite conductivity type layer within the peripheral notch of said mask; and, leaving said mask in situ while removing a portion of said opposite type semiconductive layer within said notch to reduce the area of said rectifying barrier.

2. The method of fabricating a semiconductor junction device as in claim 1, wherein said layer of opposite conductivity type semiconductive material is an epitaxial layer.

3. The method as in claim 1, in which said mask notch has an area about ⅕ to 100th of the area of said mask.

4. The method as in claim 1, in which said mask consists of a material selected from the group consisting of silicon monoxide, silicon dioxide, magnesium hydroxide, magnesium oxide, magnesium fluoride, silicones, and graphite suspensions.

5. The method as in claim 1, in which said mask consists of silicon oxide.

6. The method as in claim 1, in which said semiconductive body consists of P-type germanium, and said epitaxial semiconductive layer consists of N-type germanium.

7. The method as in claim 1, in which said semiconductive body consists of N-type silicon, and said epitaxial layer consists of P-type silicon.

8. The method as in claim 1, in which said semiconductive body consists of P-type gallium arsenide, and said epitaxial layer consists of N-type gallium arsenide.

9. A junction device comprising a crystalline semiconductive wafer of give conductivity type;

a peripherally notched dielectric mask on one face of said wafer;

an epitaxial layer of opposite type semiconductive material on said one face within said notch only;

a rectifying barrier between said epitaxial layer and said wafer; and, a metallic layer over said mask and said epitaxial semiconductive layer.

10. A semiconductor device comprising a semiconductive wafer of given conductivity type;

a peripherally notched mask of dielectric material on one face of said wafer;

an epitaxial layer of opposite type semiconductive material on said one face within said notch only;

a rectifying barrier between said epitaxial layer and said wafer; and, a metallic layer over said mask and said epitaxial semiconductive layer, said mask being a material selected from the group consisting of silicon monoxide, silicon dioxide, magnesium hydroxide, magnesium oxide, magnesium fluoride, silicones and coloidal graphite suspensions.

11. A diode comprising an N-type germanium wafer;

a peripherally notched mask of dielectric material on one face of said wafer;

an epitaxial layer of P-type germanium on said one wafer face within said notch only;

a p-n junction between said wafer and said epitaxial layer; and, a metallic layer over said mask and said epitaxial layer.

12. A diode comprising a P-type silicon wafer;

a peripherally notched mask of dielectric material on one face of said wafer;

an epitaxial layer of N-type silicon on said one wafer face within said notch only;

a p-n junction between said wafer and said epitaxial layer; and, a metallic layer over said mask and said epitaxial layer.

13. A diode comprising a P-type gallium arsenide wafer;

a peripherally notched mask of dielectric material on one face of said wafer;

an epitaxial layer of N-type gallium arsenide on said one wafer face within said notch only;

a p-n junction between said wafer and said epitaxial layer; and, a metallic layer over said mask and said epitaxial layer.

14. A heterojunction device comprising a given conductivity type semiconductive wafer;

a peripherally notched mask of dielectric material on one face of said wafer;

an epitaxial layer of opposite conductivity type material on said one face within said notch only, the material of said epitaxial layer being different from the material of said wafer but having the same crystal structure and similar lattice constants;

a p-n junction between said wafer and said epitaxial layer; and, a metallic layer over said mask and said epitaxial layer.

References Cited by the Examiner

UNITED STATES PATENTS

| | | | |
|---|---|---|---|
| 2,981,877 | 4/1961 | Noyce | 148—33.3 |
| 2,983,631 | 5/1961 | Hanlet | 148—174 |
| 3,025,438 | 3/1962 | Wegener | 148—33 |
| 3,121,828 | 2/1964 | Irn | 148—33 |
| 3,133,336 | 5/1964 | Marinace | 148—175 |
| 3,156,591 | 11/1964 | Hale et al. | 148—175 |
| 3,184,350 | 5/1965 | Marinace | 148—175 |

DAVID L. RECK, *Primary Examiner.*

N. F. MARKVA, *Assistant Examiner.*